United States Patent [19]
Grossman et al.

[11] Patent Number: 5,936,833
[45] Date of Patent: *Aug. 10, 1999

[54] CONVERTER MODULES HAVING A BUSBAR SYSTEM FOR POWER SEMICONDUCTOR SWITCHES

[75] Inventors: Walter Grossman, Brugg; Ingo Herbst, Greifensee; Urs Meyer, Baden, all of Switzerland

[73] Assignee: ABB Daimler-Benz Transportation (Technology) GmbH, Berlin, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 09/057,976

[22] Filed: Apr. 10, 1998

[30] Foreign Application Priority Data

May 9, 1997 [DE] Germany .............. 197 19 648

[51] Int. Cl.$^6$ ..................................... H02B 1/20
[52] U.S. Cl. ............................. 361/638; 363/132
[58] Field of Search ..................... 361/637, 638, 361/649; 174/68.2, 72 B; 439/76.1; 363/132

[56] References Cited

U.S. PATENT DOCUMENTS 5,343,356 8/1994 Hancock .................. 361/637
5,544,035 8/1996 Beriger et al. ........... 363/132
5,777,849 7/1998 Bayerer et al. .......... 361/730

FOREIGN PATENT DOCUMENTS

4303317A1 8/1994 Germany.
4402425A1 8/1994 Germany.
19512679C1 11/1996 Germany.
196 12 839 8/1997 Germany.

OTHER PUBLICATIONS

"GTO–Hochleistungs–stromrichter fur Triebfahrzeuge mit Drehstromantrieb", Rapp, ABB Technik Apr. 1995, pp. 4–13.

"Verschienungssystem fur den Zwischenkreis eines Stromrichters", Appln. No. 19600367.9. Jan. 1996.

*Primary Examiner*—Shawn Riley
*Attorney, Agent, or Firm*—Burns, Doane, Swecker & Mathis, L.L.P.

[57] ABSTRACT

Converter modules have a busbar system for a plurality of power semiconductor switches or, preferably, IGBT power semiconductor modules (IPMs). The power semiconductor switches are arranged in pairs, facing one another or facing away from one another, close together and parallel. In accordance with exemplary embodiments, alternating current is fed in one or two phases via bridge circuits composed of two or four power semiconductor switches.

10 Claims, 6 Drawing Sheets

CONVERTER MODULES HAVING A BUSBAR SYSTEM FOR POWER SEMICONDUCTOR SWITCHES

BACKGROUND OF THE INVENTION

1. Field of the Invention

The invention relates to the field of power electronics. It is based on a converter module and a converter as claimed in the preamble of claims 1 and 10.

2. Discussion of Background

The invention relates to converter modules for high-capacity converters. The converter modules are constructed from a plurality of power semiconductor switches, by means of a busbar system. Such busbar systems have been described, for example, in the article "GTO-Hochleistungsstromrichter für Triebfahrzeuge mit Drehstromantrieb" [GTO high-capacity converters for traction vehicles using three-phase drives], ABB Technology 4/1995, pages 4–13. Power is supplied to electrically propelled locomotives via a DC intermediate circuit which is coupled on the input side to a DC network or via a mains converter to an AC network and, on the output side, supplies electrical power of variable amplitude and frequency to the three-phase asynchronous traction motors via an in general multiphase drive converter. The busbar system forms the electrical connection between the output of the mains converter—or the overhead wire for a DC network—and the power semiconductor switches or modules of the drive converter. This may be highly complex, may limit the performance of the electrical switching system, and may result in considerable costs.

In the course of development of power semiconductor switches, a change has been made from conventional thyristors or gate turn off thyristors (GTOs) to IGBTs (bipolar transistors with an insulated gate) The IGBTs are in general integrated in a module.

For relatively high currents and ratings, a plurality of modules are connected in parallel. With respect to converter families of various ratings, busbar systems are sought which allow a multiphase converter which can be designed to be modular, can be scaled easily and has low inductance.

It has been proposed in two earlier German Patent Applications (file references 196 00 367.9 and 196 12 839.0), which do not have priority, that this problem be solved by a two-dimensional arrangement of power semiconductor modules over flat DC plates and parallel phase busbars. The flat modules have plug-in contacts extending longitudinally along a narrow, long edge and are pushed into two rows per busbar of lugs, which act as mating connections, parallel to the phase busbars. The closest neighbors are in each case rotated through 180° and are connected to one another in a bridge circuit. They thus form half-bridges or bridge arm pairs, that is to say they make contact with opposite DC plates and feed current half-cycles of opposite polarity into a common phase busbar. The next-but-one neighbors are, in contrast, oriented in the same direction and form parallel-connected modules for power scaling.

This configuration still has disadvantages, such as unsatisfactory symmetry, non-ideal inductance and, in particular, structural complexity. The long, different current paths to and between the modules result in current asymmetries and uneven loads on the modules. The resultant suboptimum utilization increases as the power level or the number of modules per phase increases, which necessitates power derating. Other problems with this arrangement relate to the design aspects. A large number of different parts are required for a type range, and assembly is complex. Compliance with the minimum insulation separations and creepage distances requires particular care since the positive and negative connections are very close to one another and penetrate one another. In addition, tailor-made metal sheet sizes and individually matched components are required for each application and rating level.

According to DE 44 02 425 A1 it is, furthermore, prior art for an invertor arrangement to connect a plurality of bridge arm pairs of semiconductor switching elements in parallel along one phase busbar. The elements in each bridge arm are oriented front to back or facing away from one another or the same, and are made contact with and screwed together via longitudinal profiles. One special feature is that the phase busbar is folded up at the end and is passed back parallel, in order to reduce the inductance.

SUMMARY OF THE INVENTION

Accordingly, one object of the invention is to provide a novel busbar system for converters, which is distinguished by simplified, space-saving design and reduced assembly complexity, as well as having improved symmetry with low inductances and a high current capacity. This object is achieved according to the invention by the features of the first claim.

Specifically, the essence of the invention is that preferably plug-in power semiconductor switches are coupled in pairs, with their front or rear sides oriented to face one another and very close together, to a positive connection and a negative connection of a DC intermediate circuit and to a phase busbar. In consequence, the current paths are made symmetrical for both the load and commutation currents, and are designed to have low inductance. At the same time, various converter module versions are provided which are easy to assemble and, owing to their modular design, can easily be matched to any desired rating requirement.

A first exemplary embodiment is represented by a first single-phase converter module comprising two power semiconductor switches, whose front or rear sides face one another and which are connected in a bridge circuit.

A further exemplary embodiment is represented by a second single-phase converter module comprising four power semiconductor switches, two switching elements in each case being opposite one another and being connected in parallel in one bridge arm, and both arms being laterally adjacent, that is to say offset in the direction of the phase busbar.

A final exemplary embodiment is represented by a two-phase converter module comprising four power semiconductor switches, two switching elements in each case forming a bridge arm pair in a lateral, parallel position, and both pairs being arranged in mirror-image form with respect to the center plane, and supplying different phases.

One advantage of the busbar system according to the invention is the high level of symmetry of the arrangement of power semiconductor switching elements, which makes it possible for the current loading of the elements to be uniform, and thus allows high total current level.

It is especially advantageous that parallel-connected power semiconductor switching elements can be controlled largely without any interference, owing to the short distances from a common gate drive electronics device.

A further advantage is that a very simple, compact and modular design of a converter module can be achieved using a small number of standard components and plug-in power semiconductor switching elements.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 shows a section through a first converter module according to FIG. 2, along the line A—A, with the power semiconductor modules plugged on;

FIG. 5 shows a section through a second converter module according to FIG. 4, along the line B—B, with the power semiconductor modules plugged on;

DESCRIPTION OF THE PREFERRED EMBODIMENT

Figure 1:
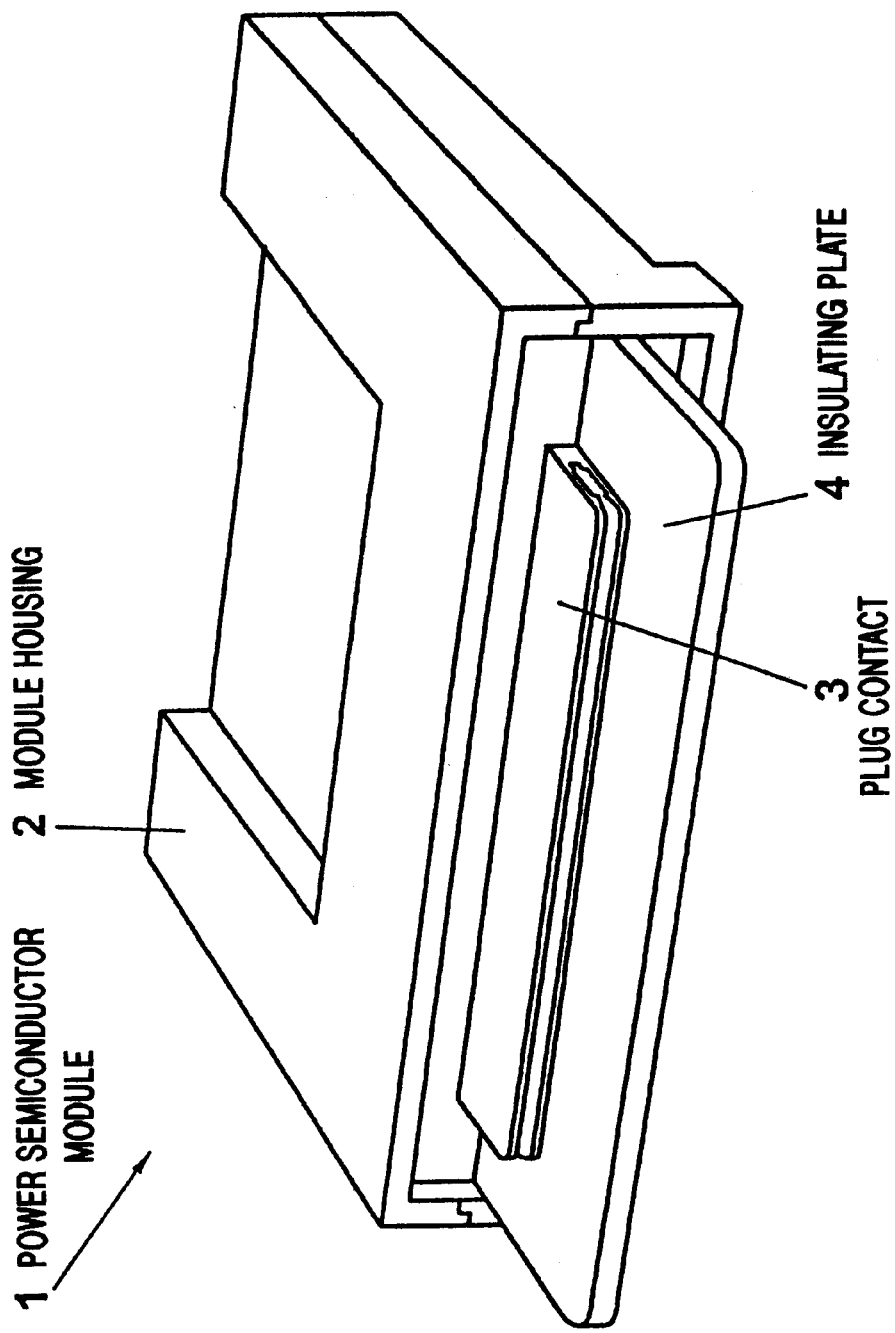
FIG. 1 shows a perspective view of a power semiconductor switch or power semiconductor module having elongated plug-in contacts (prior art)

Referring now to the drawings, wherein like reference numerals designate identical or corresponding parts through several views, FIG. 1 shows a power semiconductor switch or a power semiconductor module 1, in particular an "Intelligent Power Module" or IPM, as used in converters, voltage converters or invertors. The power semiconductor switch is accommodated, typically together with circuitry components, in a module housing 2. It makes contact with the phase via a visible, elongated plug contact 3 (DC input) with a DC pole, and via a plug contact 3 (phase output), which is concealed by the insulating plate 4. The top and bottom of the module will be referred to as the front and rear side, respectively, or as frontal sides. The power semiconductor is driven via a gate electronics device, or a gate drive, which is not illustrated here. The modules may be fitted with power semiconductors of different technologies, preferably with IGBTs. For traction purposes, a plurality of modules have to be interconnected via a busbar system in order to switch large currents and power levels. The further development of IGBTs is aimed at further increasing the switching capacities, so that the number of modules that have to be connected in parallel can be reduced in the future.

Figure 2:
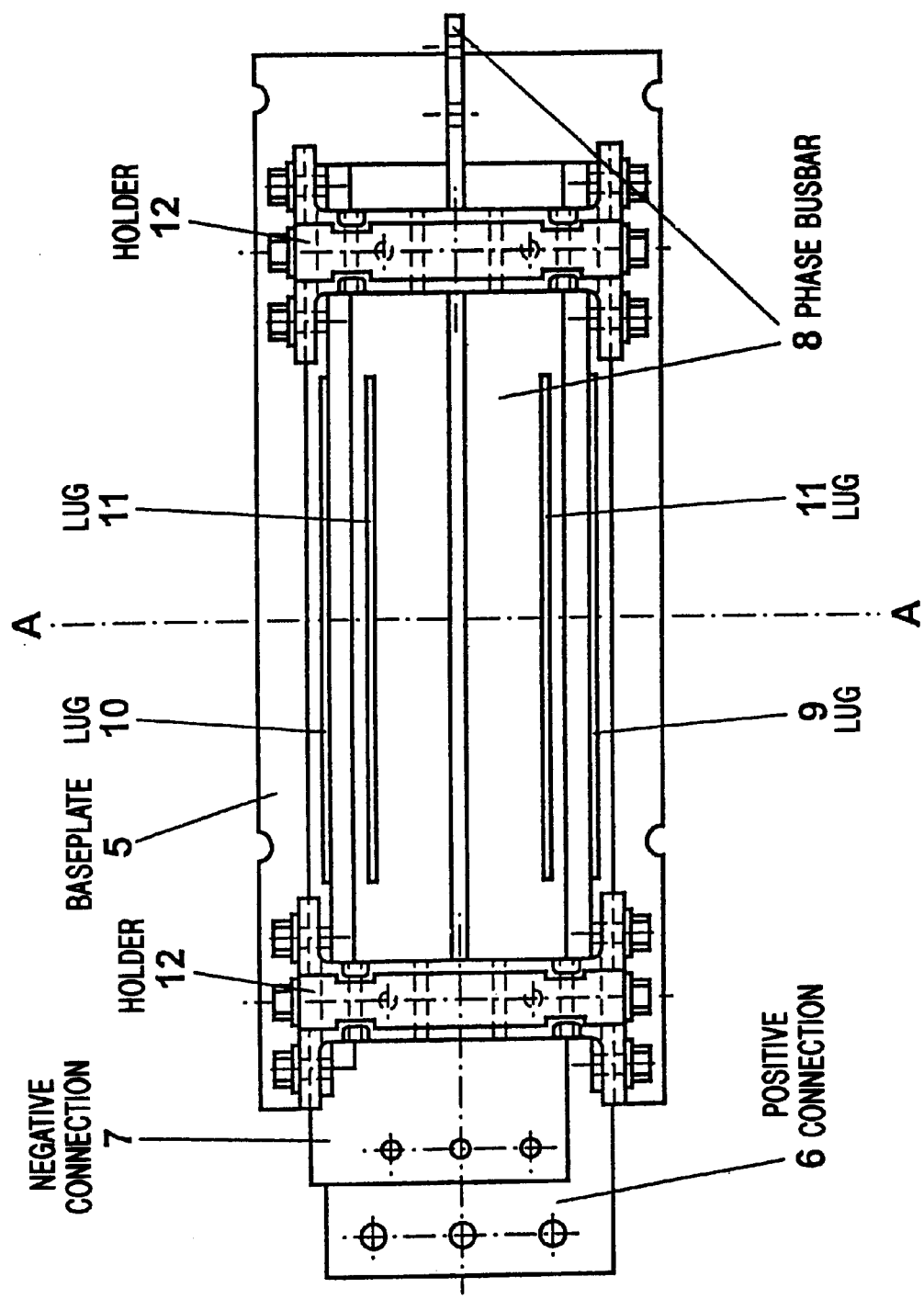
FIG. 2 shows a schematic plan view from above of a first converter module according to the invention.

FIG. 2 now discloses a first exemplary embodiment of a busbar system according to the invention, which is designed for the minimum number of two power semiconductor modules per phase and is optimized in terms of switching characteristics, space saving and design simplicity. On the left-hand side, the plan view shows a positive connection 6 and a negative connection 7, in the form of busbars, for connection to the DC intermediate circuit, in the center and on both longitudinal sides, first lugs 9 and 10 for the positive connection and negative connection respectively as well as second lugs 11 for a phase connection 8 and, on the right hand side, the phase connection or the phase outgoer busbar 8, which is routed to the exterior on the right. A first and a second lug in each case interact in order to hold and make contact with a power semiconductor switch. The lugs 9, 10, 11 preferably point up at right angles and are oriented parallel to the longitudinal sides, so that the switches are opposite one another, close together, with their front or rear sides facing one another.

Figure 3:
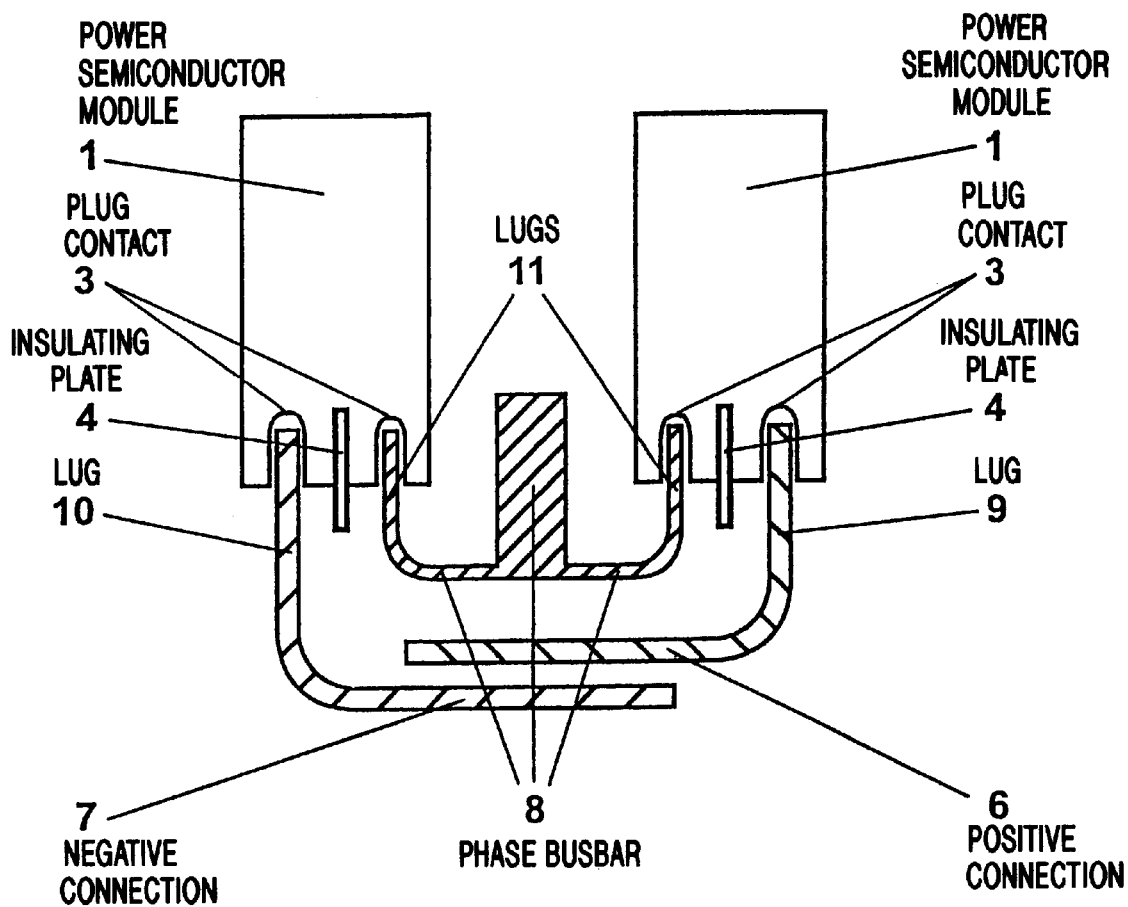

The section along A—A (FIG. 3) illustrates the arrangement according to the invention. The illustration shows the essentially "L"-shaped cross-section profiles of the positive connection 6 and negative connection 7, and the essentially "W"-shaped cross-sectional profile of the phase busbar 8, as well as its interaction with two power semiconductor modules 1. With regard to the phase busbar 8, the center ridge may be more or less pronounced or may even be absent, to create a "U"-shaped profile. All the profiles are mounted on a baseplate 5, together with holders 12, via insulation elements which are not illustrated, and form a compact component. The holders and insulation elements may, in particular, also be directly integrated in the baseplate. Air, gas, solid insulators or a combination of them may be used as insulation media between the live parts 6, 7 and 8, the minimum separations being governed by the appropriate insulation distance and creepage distance conditions. The surfaces may be, but need not be, coated to be insulating. Finally, the insertion of two power semiconductor modules 1 from above creates an extremely compact and mechanically robust converter module.

This arrangement is highly advantageous from many points of view. The current paths are very wide, short, and of virtually the same dimensions for both power semiconductor switching elements. They do not enclose any areas to create inductance, and opposite current directions are close together. In addition to a very high current capacity, these measures achieve, in particular, a very low inductance of about 25 nH in the commutation circuit. Commutation in this case refers to the switching processes, which in some cases are in the order of microseconds, by means of which the power semiconductors exchange high-frequency currents for mutual relief.

Figure 4:
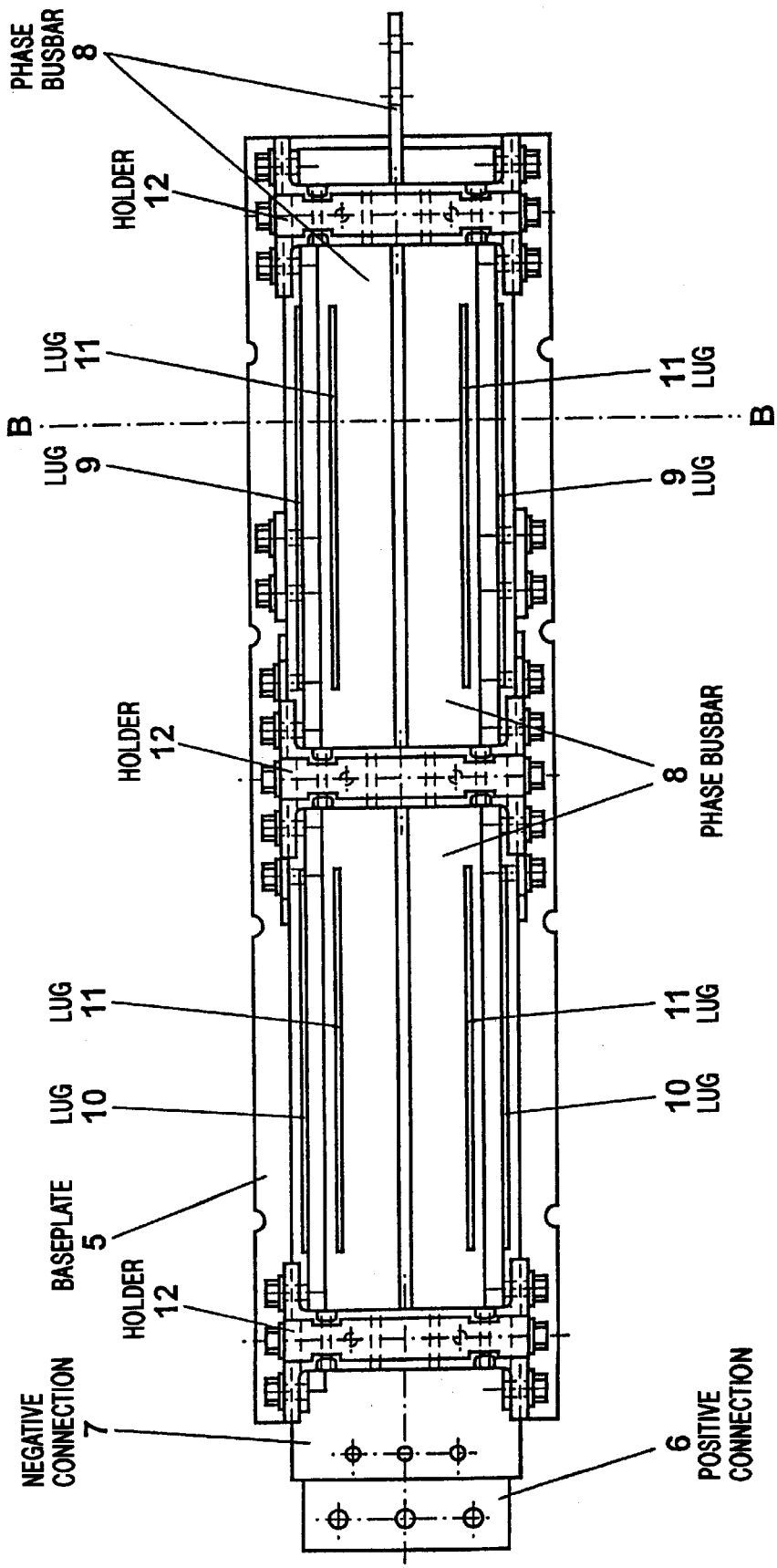
FIG. 4 shows a schematic plan view from above of a second converter module according to the invention.
Figure 5:
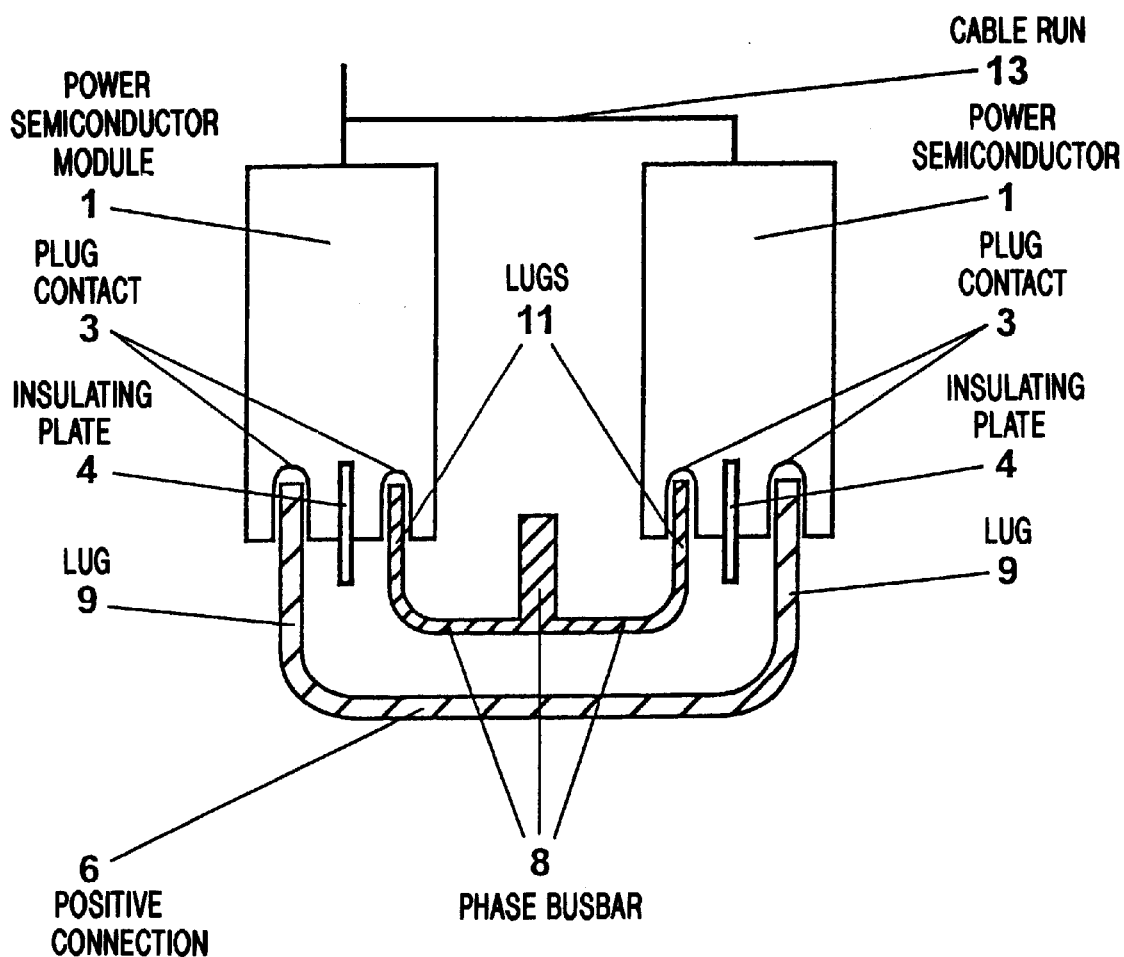

A second exemplary embodiment is shown in FIG. 4 and the associated sectional view along B—B in FIG. 5. In this case, the positive connection 6 and negative connection 7 have an essentially "U"-shaped cross-sectional profile with first lugs 9, 10 on both longitudinal sides, and the phase connection 8 once again has an essentially "W"-shaped or "U"-shaped cross-sectional profile with two lugs 11 on both longitudinal sides. This converter module has four mounting spaces for power semiconductor switches. Two power semiconductor switches are in each case positioned opposite one another, with their front or rear sides facing one another, and are connected in parallel. They are connected to the adjacent pair at the side, in a half-bridge circuit.

In this arrangement, the symmetry is reduced in that the positive connection 6 has to supply the power semiconductor switch pair located further to the rear, via the lugs 9. It is thus made contact with from underneath via a flat feed plate. However, the resultant inductance of the commutation circuit is typically about 50 nH, and thus always achieves very low values. A further advantage is that the parallel-connected power semiconductor switching elements can in each case be driven by a common gate drive, since the problem of dangerous induced voltage spikes is largely suppressed owing to the very short cable run 13.

Figure 6:
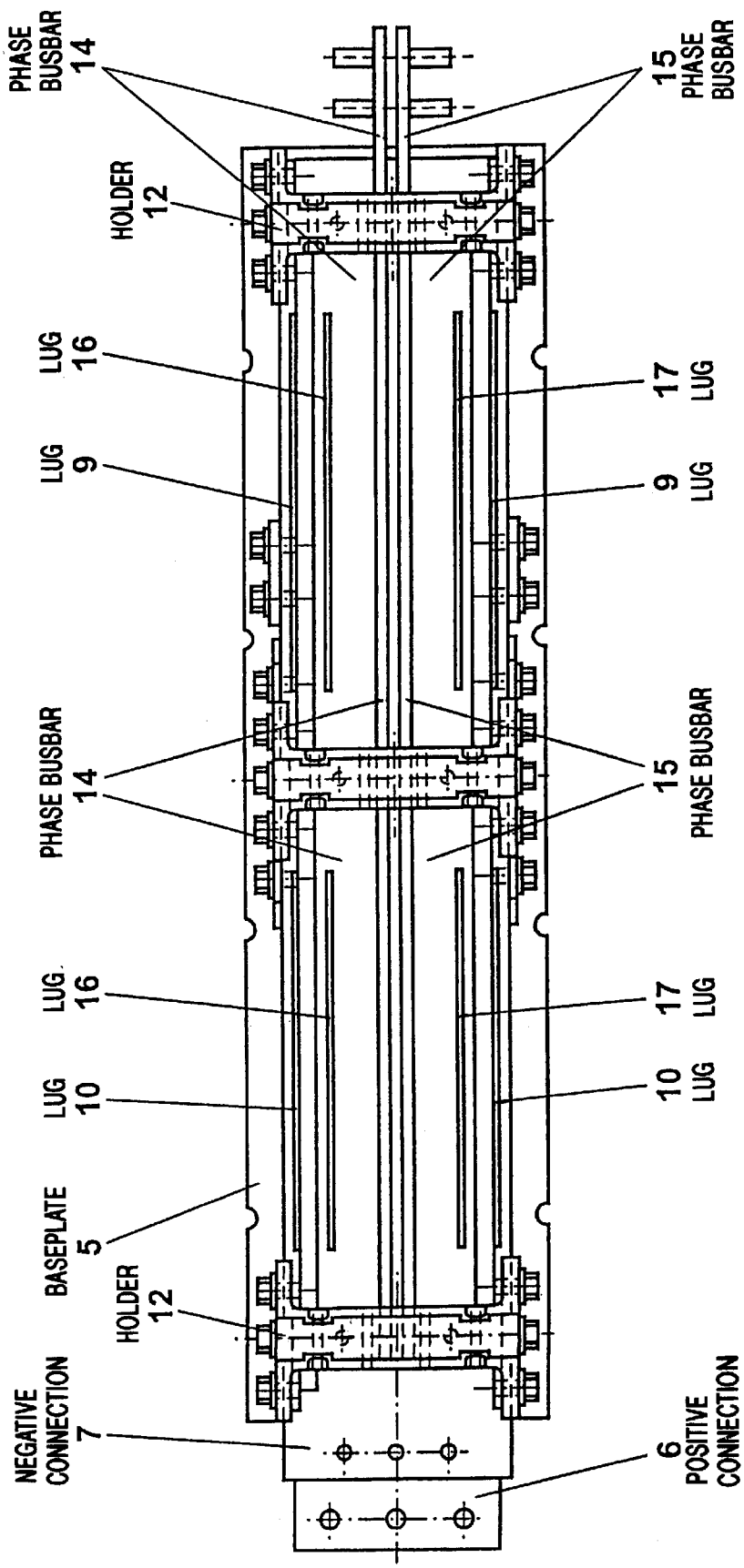
FIG. 6 shows a schematic plan view from above of a third converter module according to the invention.

FIG. 6 shows an extremely compact arrangement for supplying two phases. This arrangement is based on FIGS. 4 and 5 by separating the phase busbar 8 along its center line and the gate feed line 13. The resultant phase busbars 14 and 15 have half the width, and have a half-"W"-shaped or a "U"-shaped profile in the region of the lugs 16 and 17, respectively. The two phase busbars run parallel in the longitudinal direction, and lie close to one another. The power semiconductor switches, which are arranged laterally offset on the same longitudinal side and make contact with different "U" profiles 6, 7, each form a half-bridge and make contact with phase connection 14, 15. In a similar way to that in the second exemplary embodiment, but separately for each half bridge, the commutation currents flow through the busbars in the longitudinal direction.

In all the examples referred to, the busbar system according to the invention is distinguished by economically significant design advantages. A small number of components are used which can be produced, for example, from aluminum extrusions or bent brass parts with minimal production effort. Very good compliance with mechanical tolerances is equally possible, and the busbar system is also suitable for high currents in the kA range. For power scaling, the compact converter modules can be packed very closely alongside one another (FIGS. 2–6) and can be interconnected for larger units, without components having to be adapted.

The converter modules according to the invention are distinguished by very low inductances. In consequence, very steep switching flanks and very high switching frequencies can be achieved, and the loads on the power semiconductors, as well as the reactions on the network, can be kept low. Furthermore, all the embodiments allow the amount of derating of the power semiconductor switches to be very low. This is achieved by the high level of symmetry of the bridge arms. In addition, derating is avoided if the power semiconductor modules are connected in parallel, since potential differences between the gates of parallel modules are minimized owing to the fact that the busbar system between the parallel-connected modules has very low inductance, and the gate drive connecting lines are designed to be very short.

A particularly advantageous feature of all the exemplary embodiments is the use of plug-in power semiconductor switches or power semiconductor modules. The first and second lugs then act as plug-in spaces for the power semiconductor switches.

In the examples, the roles of the positive connection 6 and negative connection 7 may be reversed. It is also feasible for the arrangement of the DC connections 6, 7 and the phase connection 8 to be interchanged (see, for example, FIG. 3). The first and second lugs then change places, the power semiconductor modules are mounted rotated through 180° C., and a broadened phase connection 8 is passed out underneath the DC connections.

Further versions of the invention also result, for example, by arranging a plurality of power semiconductor switches, instead of just one, connected in parallel in the longitudinal direction. This can easily be achieved by using longer lugs or a plurality of lugs, made contact with in the same way, laterally alongside one another. This allows power scaling in all three embodiments (FIGS. 2–6). In the same way, a plurality of converter modules, including different modules, can be interconnected via their phase connections 8, 14, 15, for power scaling.

Overall, the invention provides a busbar system by means of which converter modules having optimum switching characteristics and a space-saving, modular design can be achieved.

Obviously, numerous modifications and variations of the present invention are possible in light of the above teachings. It is therefore to be understood that, within the scope of the appended claims, the invention may be practiced otherwise than as specifically described herein.

LIST OF DESIGNATIONS

1 Power semiconductor switch or power semiconductor module
2 Module housing
3 Plug-in contact
4 Insulating plate
5 Baseplate
6 Positive connection
7 Negative connection
8 Phase connection
9 First lugs (positive pole)
10 First lugs (negative pole)
11 Second lugs (phase)
12 Holder
13 Gate feed line
14 Phase connection 1
15 Phase connection 2
16 Second lugs (phase 1)
17 Second lugs (phase 2)

What is claimed as new and desired to be secured by Letters Patent of the United States is:

1. A converter module having power semiconductor switches (1) and a busbar system, comprising a positive connection (6), and negative connection (7) and a phase connection (8, 14, 15) which is in the form of a busbar, which connections are stacked one on top of the other with the interposition of insulating elements and are mounted on a baseplate (5), wherein
   a) the positive connection (6) and the negative connection (7) are in the form of busbars and have at least one first projecting lug (9, 10) on one longitudinal side,
   b) each phase connection (8, 14, 15) has at least one second projecting lug (11, 17, 18) on its longitudinal side,
   c) the first and the second lugs interact in order to hold and make electrical contact with the power semiconductor switch, and
   d) in each case two power semiconductor switches are arranged in pairs on opposite longitudinal sides of the positive/negative/phase connections, with their front or rear sides facing one another.

2. The converter module as claimed in claim 1, wherein
   a) the busbars are stacked one on top of the other in the sequence positive/negative/phase connection or negative/positive/phase connection,
   b) the first lugs (9, 10) and the second lugs (11, 16, 17) extend in the direction of the busbars and project upward essentially at right angles,
   c) the pairs of power semiconductor switches are oriented with their phase outputs facing one another, and
   d) in particular, the power semiconductor switches can be plugged in.

3. The converter module as claimed in claim 2, wherein
   a) the positive connection (6) and the negative connection (7) have an essentially "L"-shaped cross-sectional profile,
   b) the two "L" profiles (6, 7) are interleaved with one another such that their first lugs (9, 10) are on opposite longitudinal sides,
   c) the phase connection (8) has a "W" or "U"-shaped cross-sectional profile with two lugs (11) on both longitudinal sides, d) the "W" or "U" profile (8) is mounted between the "L" profiles (6, 7) such that the second lugs (11) are arranged longitudinally next to the first lugs (9, 10), and e) the pairs of power semiconductor switches are connected in a half-bridge circuit.

4. The converter module as claimed in claim 3, wherein a) the positive connection (6) and negative connection (7) each have one, and only one, first lug (9, 10), b) the phase connection (8) has two, and only two, second lugs (11), and c) two, and only two, power semiconductor switches are made contact with.

5. The converter module as claimed in claim 2, wherein a) the positive connection (6) and the negative connection (7) have an essentially first "U"-shaped cross-sectional profile with first lugs (9, 10) on both longitudinal sides, b) the two first "U" profiles (6, 7) are arranged one behind the other, the profile which is arranged further to the rear in the longitudinal direction comprising a flat feed plate for making contact with the DC intermediate circuit, c) the phase connection (8) has a "W" or second "U"-shaped cross-sectional profile with second lugs (11) on both longitudinal sides, d) the "W" or second "U" profile (8) is mounted between the two first "U" profiles (6, 7) such that its lugs (11) are arranged longitudinally next to the lugs (9, 10) of the first "U" profiles, and e) the pairs of power semiconductor switches which are made contact with via even-numbered first "U" profiles are connected in a parallel circuit, and the pairs which are made contact with via odd-numbered first "U" profiles are connected in a half-bridge circuit.

6. The converter module as claimed in claim 5, wherein a) the positive connection (6) and the negative connection (7) each have two, and only two, mutually opposite lugs (9, 10) on both longitudinal sides, b) the phase connection (8) has four, and only four, lugs (11), and c) two, and only two, pairs of power semiconductor switches are made contact with.

7. The converter module as claimed in claim 2, wherein a) the positive connection (6) and negative connection (7) have an essentially "U"-shaped cross-sectional profile with first lugs (9, 10) on both longitudinal sides, b) the two "U" profiles (6, 7) are arranged one behind the other, the profile which is arranged further to the rear in the longitudinal direction comprising a flat feed plate in order to make contact with the DC intermediate circuit, c) two phase connections (14, 15) which run parallel in the longitudinal direction lie closely side-by-side and each has a half-"W"-shaped cross-sectional profile, d) each half-"W"-profile (14, 15) has second lugs (16, 17) on its longitudinal side which faces away from the other phase connection, e) each half-"W"-profile (14, 15) is mounted between the "U" profiles (6, 7) such that its second lugs (16, 17) are arranged longitudinally next to the first lugs (9, 10) of the "U"-profiles, and f) the power semiconductor switches which are arranged on the same longitudinal side but make contact with different "U"-profiles form a half-bridge and make contact with one, and only one, phase connection (14, 15).

8. The busbar system as claimed in claim 7, wherein a) the positive connection (6) and the negative connection (7) each have two, and only two, lugs (9, 10), b) each phase connection (14, 15) has two, and only two, lugs (16, 17), and c) four, and only four, power semiconductor switches are made contact with.

9. The converter module as claimed in claim 1, wherein a) the positive connection (6), negative connection (7) and phase connections (8, 14, 15) are stacked very closely one above the other for minimum inductance, and b) air, gas or solid insulation, or a combination of these media, are provided as insulation media.

10. A converter having an intermediate circuit, bridge arms connected to it and phase connections on the output side, wherein a) the electrical connection between the intermediate circuit and the phase connections comprises converter modules as claimed in one of the preceding claims, and b) in particular, a number of converter modules with busbars as claimed in one of the preceding claims, are interconnected, corresponding to the number of phase connections and a required rating of the converter, or corresponding to a number of power semiconductor switches or power semiconductor modules to be connected in parallel.

* * * * *